(12) United States Patent
Sohn et al.

(10) Patent No.: US 11,053,438 B2
(45) Date of Patent: Jul. 6, 2021

(54) FLUORIDE-BASED PHOSPHORS FOR LIGHT EMITTING DEVICE

(71) Applicant: INDUSTRY-ACADEMIA COOPERATION GROUP OF SEJONG UNIVERSITY, Seoul (KR)

(72) Inventors: Kee-sun Sohn, Seoul (KR); Min-seuk Kim, Seoul (KR)

(73) Assignee: INDUSTRY-ACADEMIA COOPERATION GROUP OF SEJONG UNIVERSITY, Seoul (KR)

( * ) Notice: Subject to any disclaimer, the term of this patent is extended or adjusted under 35 U.S.C. 154(b) by 50 days.

(21) Appl. No.: 16/572,515

(22) Filed: Sep. 16, 2019

(65) Prior Publication Data

US 2020/0102493 A1  Apr. 2, 2020

(30) Foreign Application Priority Data

Sep. 27, 2018  (KR) .......................... 10-2018-0114807

(51) Int. Cl.
| | |
|---|---|
| *H01L 33/00* | (2010.01) |
| *H01L 31/0203* | (2014.01) |
| *H01L 21/00* | (2006.01) |
| *C09K 11/61* | (2006.01) |
| *H01L 33/50* | (2010.01) |
| *H01L 33/52* | (2010.01) |

(52) U.S. Cl.
CPC ............ *C09K 11/61* (2013.01); *H01L 33/502* (2013.01); *H01L 33/52* (2013.01); *H01L 2924/181* (2013.01)

(58) Field of Classification Search
CPC ... H01L 33/502; H01L 33/504; H01L 33/501; H01L 33/50; H01L 2924/181
See application file for complete search history.

(56) References Cited

U.S. PATENT DOCUMENTS

| | | | | |
|---|---|---|---|---|
| 9,564,557 | B2* | 2/2017 | Weiler | C09K 11/025 |
| 2015/0295144 | A1* | 10/2015 | Weiler | H01L 25/0753 |
| | | | | 362/84 |
| 2016/0244663 | A1* | 8/2016 | Murphy | C09K 11/617 |
| 2017/0162758 | A1* | 6/2017 | Weiler | F21V 9/08 |
| 2018/0022993 | A1* | 1/2018 | You | C09K 11/025 |
| | | | | 428/403 |
| 2019/0074412 | A1* | 3/2019 | Murphy | H01L 33/62 |
| 2021/0040614 | A1* | 2/2021 | Tragi | C23C 16/45553 |

FOREIGN PATENT DOCUMENTS

EP       3628720 A1 *  4/2020 ........... C09K 11/616

* cited by examiner

*Primary Examiner* — Alonzo Chambliss
(74) *Attorney, Agent, or Firm* — Lex IP Meistere, PLLC

(57) ABSTRACT

The invention relates to a red phosphor with a narrow full width at half maximum, having improved decay time and resolving afterglow phenomenon. The fluoride-based phosphor according to the invention is characterized in including a host having a composition of the following [Formula 1] including rubidium (Rb), cesium (Cs), silicon (Si) and fluorine (F) as constituent elements, and manganese (Mn) which is solid solution treated in the host as an activator:

$$Rb_{3-x}Cs_xSiF_7 \qquad \text{[Formula 1]}$$

(where, $0<x<3$).

8 Claims, 6 Drawing Sheets

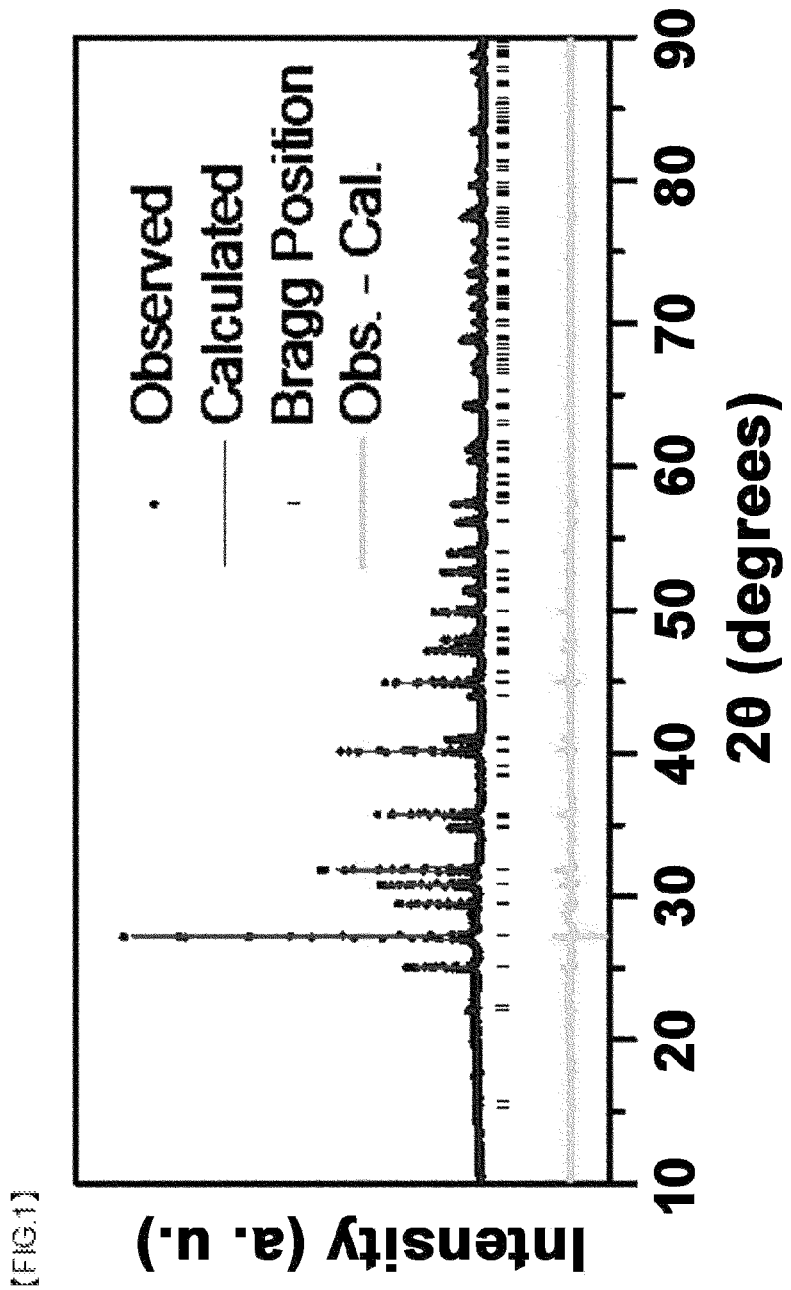

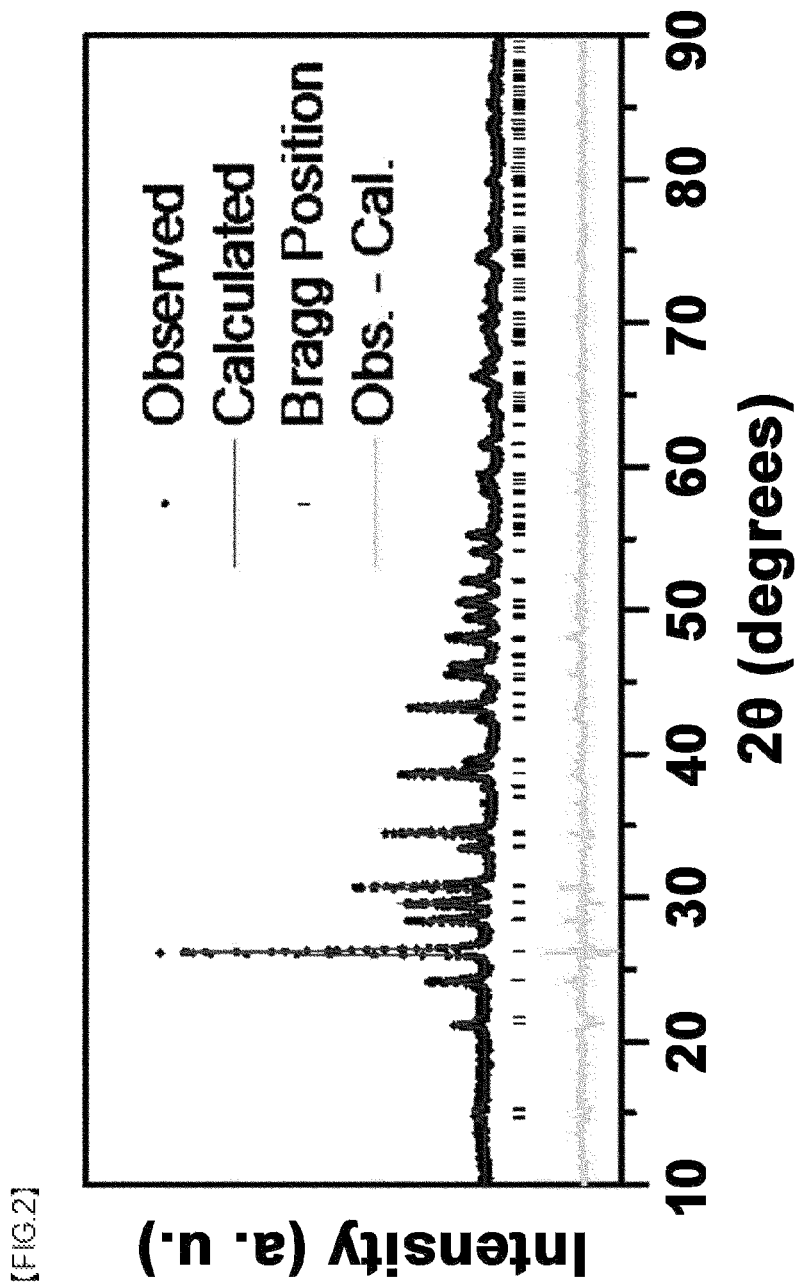
[FIG. 2]

[FIG.3]
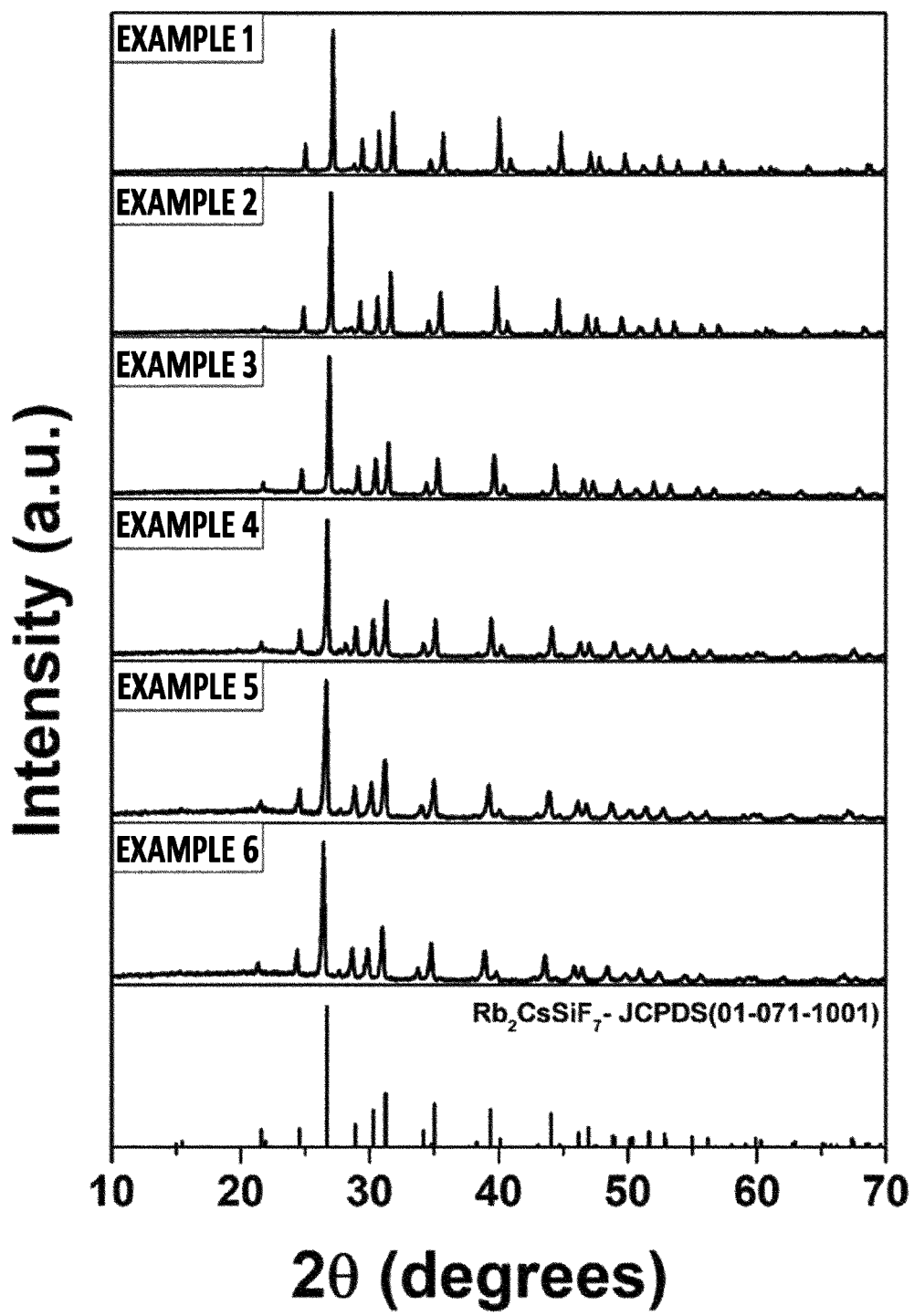

[FIG.4]
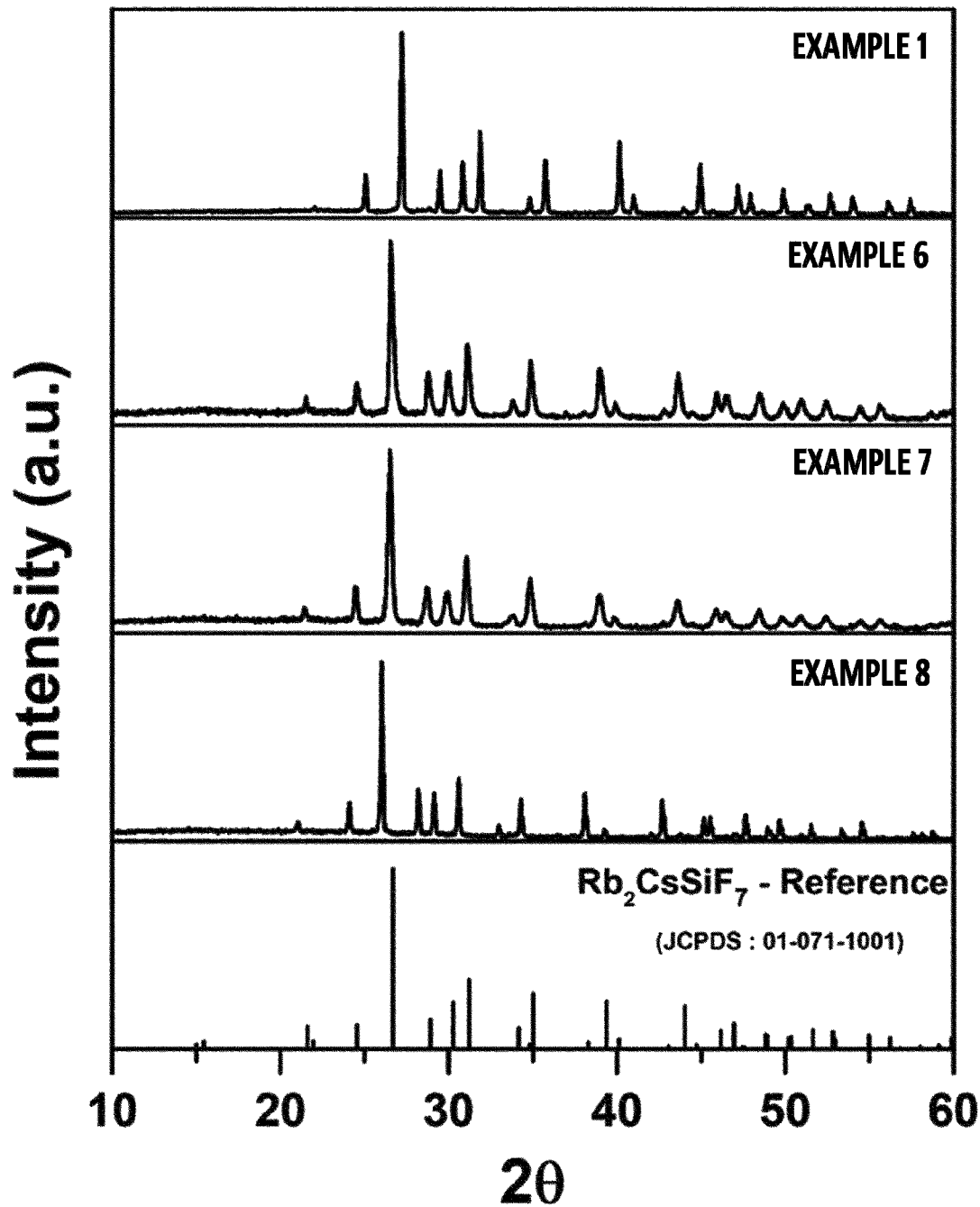

[FIG.5]
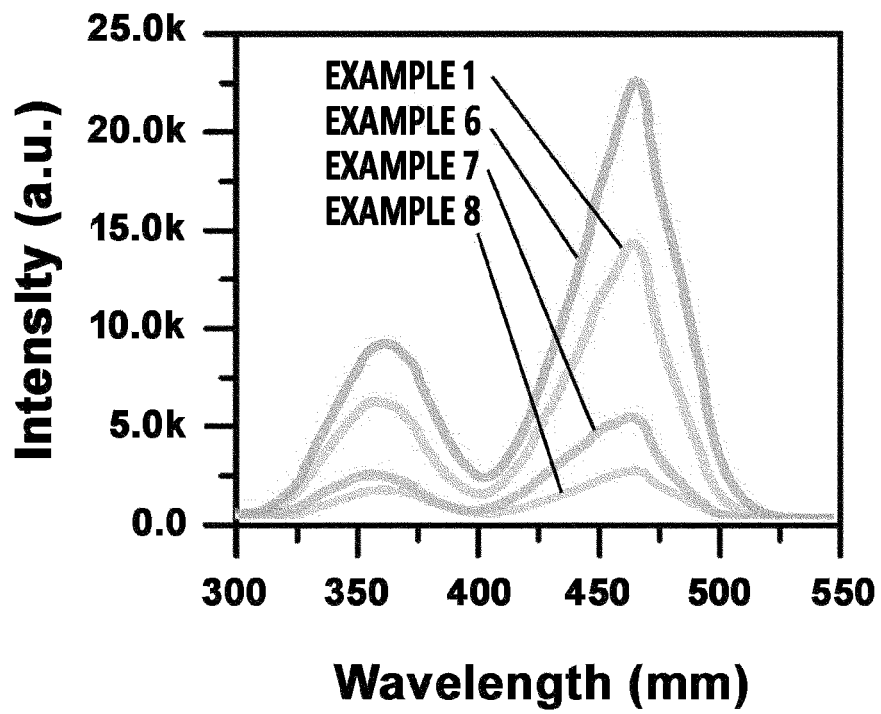
[FIG.6]
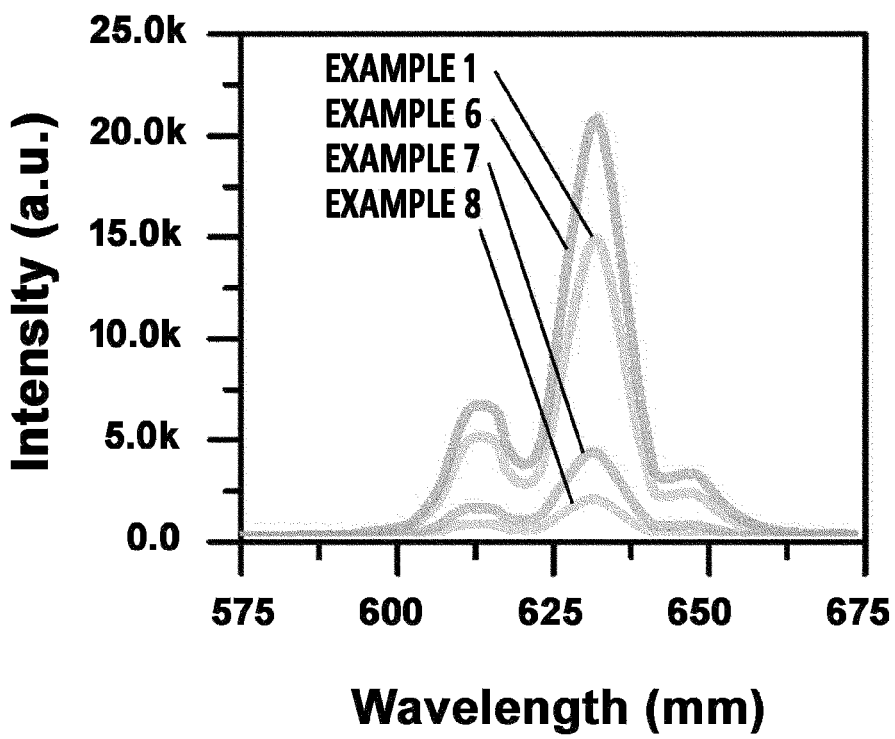

[FIG.7]
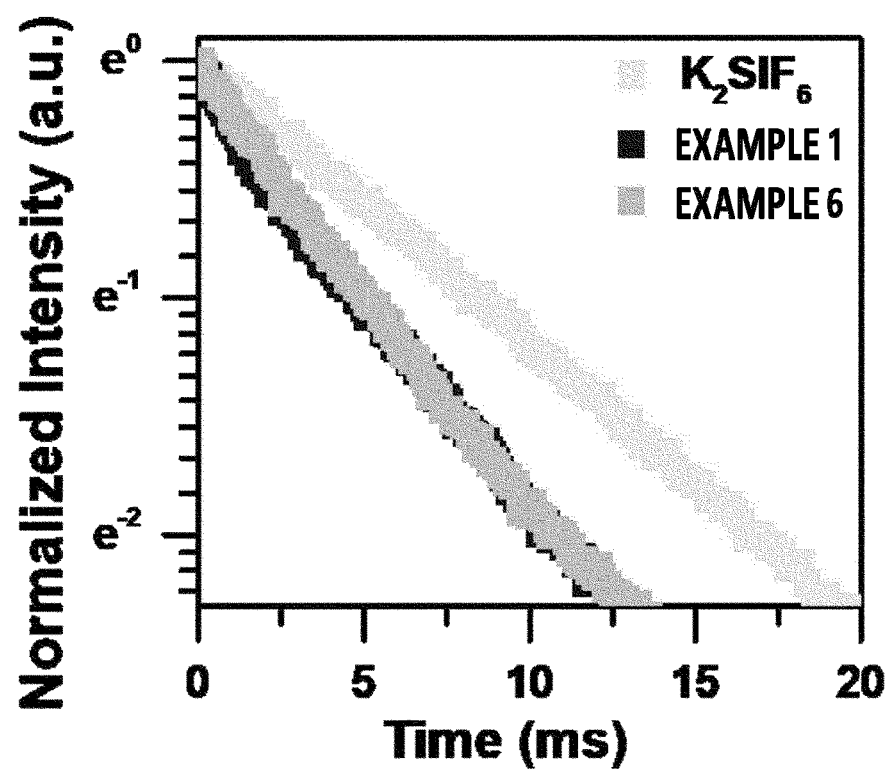

FLUORIDE-BASED PHOSPHORS FOR LIGHT EMITTING DEVICE

BACKGROUND OF THE INVENTION

1. Field of the Invention

The present invention relates to a fluoride-based phosphor, and more particularly, to a red phosphor having faster decay time than a commercially available $K_2SiF_6:Mn^{4+}$ phosphor and capable of resolving afterglow phenomenon.

2. Description of the Related Art

A white LED light-emitting device recently getting the limelight as a lighting, an LCD backlight, an automobile light, and the like, commonly includes an LED light emitting unit emitting blue or ultraviolet light and a phosphor transforming wavelengths into visible light by using the emitted light from the light emitting unit as an excitation source.

In one method for accomplishing the white LED, a blue light emitting diode using InGaN-based material having a wavelength of 450 to 550 nm is used as a light emitting unit, and a yellow light emitting YAG-based phosphor represented by the empirical formula of $(Y,Gd)_3(Al, Ga)_5O_{12}$ is used as a phosphor. However, recently, in order for high color reproduction, white light with excellent color rendering is accomplished through a method of blending a phosphor such as a $K_2SiF_6:Mn^{4+}$ phosphor which is a fluoride-based phosphor.

However, in case of the $K_2SiF_6:Mn^{4+}$ phosphor, due to slow decay time inherent in an $Mn^{4+}$ activator, there is a problem of generating afterglow phenomenon. In order to resolve such afterglow phenomenon, a red phosphor having a faster decay time than the conventional fluoride-based red phosphor is required.

PRIOR ART DOCUMENTS

Patent Documents (Patent Document 1) Korean Laid-open Patent publication No. 2015-0126298
(Patent Document 2) Korean Laid-open Patent publication No. 2017-0085168

SUMMARY OF THE INVENTION

The task to solve in the invention is to provide a fluoride-based red phosphor which has sufficient light-emitting efficiency and accomplishes faster decay time than the conventional fluoride-based red phosphor, and a light-emitting device including the phosphor.

According to an embodiment of the invention to solve the task, there is provided a fluoride-based phosphor including a host having a composition of the following [Formula 1] including rubidium (Rb), cesium (Cs), silicon (Si) and fluorine (F) as constituent elements, and manganese (Mn) which is solid solution treated in the host as an activator:

$$Rb_{3-x}Cs_xSiF_7 \qquad \text{[Formula 1]}$$

(where, 0<x<3)

According to another embodiment of the invention to solve the task, there is provided a light-emitting device including a light-emitting unit for emitting excited light and a wavelength conversion part for absorbing the excited light and emitting visible light, wherein the wavelength conversion part includes a fluoride-based phosphor including a host having a composition of the following [Formula 1] including rubidium (Rb), cesium (Cs), silicon (Si) and fluorine (F) as constituent elements, and manganese (Mn) which is solid solution treated in the host as an activator:

$$Rb_{3-x}Cs_xSiF_7 \qquad \text{[Formula 1]}$$

(where, 0<x<3)

Advantages of the Invention

Since the fluoride-based phosphor according to the invention shows even faster decay time than a currently commercialized $K_2SiF_6:Mn^{4+}$ phosphor, afterglow phenomenon which may arise if applied to a light-emitting device in a region such as a LED device, a white LED, and a display, may be resolved.

BRIEF DESCRIPTION OF THE DRAWINGS

FIG. 1 shows results obtained by interpreting crystal information using X-ray diffraction results on a phosphor prepared according to Example 1.
FIG. 2 shows results obtained by interpreting crystal information using X-ray diffraction results on a phosphor prepared according to Example 6.
FIG. 3 shows X-ray diffraction analysis results on Examples 1-6.
FIG. 4 shows X-ray diffraction analysis results on Examples 1, 6, 7 and 8.
FIG. 5 shows measured results of absorption spectrum on Examples 1, 6, 7 and 8.
FIG. 6 shows measured results of emission spectrum on Examples 1, 6, 7 and 8.
FIG. 7 shows compared results on decay times of Examples 1 and 6 and $K_2SiF_6:Mn^{4+}$ as the Comparative Examples.

DETAILED DESCRIPTION OF THE EXEMPLARY EMBODIMENTS

Hereinafter, embodiments of the invention will be explained in detail with reference to attached drawings. However, the embodiments of the invention illustrated hereinafter may be changed in various other types, and the scope of the invention is not limited to the embodiments described below. The embodiments of the invention are provided for more completely explaining the invention to a person having an average knowledge in the art.

Phosphor and Light-Emitting Device

The phosphor according to the invention is characterized in including a host having a composition of the following [Formula 1] including rubidium (Rb), cesium (Cs), silicon (Si) and fluorine (F) as constituent elements, and manganese (Mn) which is solid solution treated in the host as an activator:

$$Rb_{3-x}Cs_xSiF_7 \qquad \text{[Formula 1]}$$

(where, 0<x<3)

That is, the phosphor according to the invention is different from the phosphors disclosed in the above-described Patent Documents 1 and 2, which use a host including potassium (K), silicon (Si) and fluorine (F) with an activator, in that the phosphor according to the invention uses a host including rubidium (Rb) and cesium (Cs). The simultaneous use of rubidium (Rb) and cesium (Cs) may induce difference of elements present in a crystal structure and may accomplish even faster decay time than the phosphor using the host including potassium (K), silicon (Si) and fluorine (F), thereby resolving afterglow phenomenon.

In addition, in the phosphor, the molar ratio of rubidium (Rb), cesium (Cs) and silicon (Si) contained in the host may preferably be 2:1:1.

In addition, in the phosphor, if the molar ratio of the solid solution amount of the activator is less than 0.001, light-emitting element is deficient, and luminance becomes insufficient and decay time may be deteriorated. If the molar ratio is greater than 0.2, due to so-called concentration quenching effect, luminance may be reduced. Accordingly, the range is preferably maintained in a range of 0.001 to 0.2 considering decay time and light-emitting intensity.

In addition, if measured by the time consumed for decreasing light-emitting intensity to 10%, the phosphor may preferably have decay time of less than 14 ms.

In addition, the phosphor may have an excitation wavelength of 365 to 480 nm and a wavelength of luminescent center of 610 to 670 nm.

In addition, in the phosphor, the crystal structure of the host may be tetragonal.

In addition, in the phosphor, the lattice constants of the host are a=b=8.1466 Å, and c=5.9650 Å, and the lattice constant may be variable within 10%.

In addition, the phosphor of the composition according to the invention is ideally composed of a single phase, but a small amount of inevitable amorphous phase or a crystal phase other than tetragonal may be included during preparing, and a mixture including such amorphous phase or other crystal phase may be partially included as long as the properties of the phosphor are not affected.

In addition, the average particle size of the phosphor according to the invention is preferably in a range of 1 to 20 μm. If the average particle size is less than 1 μm, light absorption rate is degraded due to scattering and uniform dispersion in a resin for sealing an LED may not be easy, and if the average particle size is greater than 20 μm, non-uniformity of light-emitting intensity and color may arise.

In addition, the light-emitting device according to the invention is characterized in including a light-emitting unit for emitting excited light and a wavelength conversion part for absorbing the excited light and emitting visible light, wherein the wavelength conversion part includes a fluoride-based phosphor including a host having a composition of the following [Formula 1] including rubidium (Rb), cesium (Cs), silicon (Si) and fluorine (F) as constituent elements, and manganese (Mn) which is solid solution treated in the host as an activator:

$$Rb_{3-x}Cs_xSiF_7$$ [Formula 1]

(where, 0<x<3)

The light-emitting unit may preferably be an optional light source in which light emitted from the unit may be introduced into the wavelength conversion part to generate white light. The wavelength of the emitted light from the light-emitting unit may preferably be blue light or UV light, having a peak wavelength of about 365-480 nm. The light-emitting unit may more preferably be a blue light-emitting diode.

Method for Preparing Phosphor

As materials for preparing a phosphor, $Rb_2SiF_6$, $Cs_2SiF_6$, CsF and RbF powders including the main component of the host, and a $K_2MnF_6$ powder including the activator component were used. The materials were mixed to a predetermined composition after selecting and weighing the materials, and in this case, the amount of the mixture per sample was set to 1 g. The mixing of the above-described raw materials was manually performed in an atmosphere for 10 minutes.

The mixture samples thus obtained were sintered in a hydrogen and nitrogen gas atmosphere which includes hydrogen and nitrogen gases in an atmospheric pressure as main components, and by sintering in such a hydrogen and nitrogen gas atmosphere, the oxidation of a fluoride synthesized during sintering may be prevented or restrained, and the composition deviation of the fluoride thus produced may be reduced, thereby producing a phosphor composition having excellent performance.

Meanwhile, the use of hydrogen and nitrogen gases as main components mean that 5% of a hydrogen gas and 95% of a nitrogen gas are included by volume ratio in a total gas. In addition, the sintering temperature is preferably 200 to 400° C., and the sintering process is more preferably performed at 250° C. or more to obtain a phosphor with high quality. In addition, the sintering time may be in a range of 10 minutes to 10 hours, preferably, 2 to 8 hours considering quality and productivity.

In order to obtain the phosphor according to an embodiment of the invention, sintering is performed in a gas atmosphere including a hydrogen gas and a nitrogen gas in 5% and 95%, respectively, at a sintering temperature of 300° C. for 3 hours to synthesize a fluoride phosphor, and crushing is performed to prepare a phosphor powder.

Hereinafter, the fluoride-based phosphor of the invention will be explained in detail referring to more preferred embodiments.

Example 1

1 g of a raw material powder mixture was obtained by respectively weighing 0.6675 g of $Rb_2SiF_6$, 0.3272 g of RbF, and 0.0053 g of $K_2MnF_6$ as raw material powders and manually mixing them using a mortar in the atmosphere. 1 g of the raw material powder mixture thus mixed was charged in a crucible, sintered at 300° C. for 3 hours while flowing hydrogen/nitrogen gases in 500 cc per minute into a sintering furnace, and crushed to obtain a phosphor composition. It was confirmed that red light was emitted if this phosphor composition was excited with a light source of 450 nm.

Example 2

1 g of a raw material powder mixture was obtained by respectively weighing 0.5132 g of $Rb_2SiF_6$, 0.1672 g of $Cs_2SiF_6$, 0.3145 g of RbF, and 0.0051 g of $K_2MnF_6$ as raw material powders and manually mixing them using a mortar in the atmosphere. 1 g of the raw material powder mixture thus mixed was charged in a crucible, sintered at 300° C. for 3 hours while flowing hydrogen/nitrogen gases in 500 cc per minute into a sintering furnace, and crushed to obtain a phosphor composition. It was confirmed that red light was emitted if this phosphor composition was excited with a light source of 450 nm.

Example 3

1 g of a raw material powder mixture was obtained by respectively weighing 0.3705 g of $Rb_2SiF_6$, 0.3219 g of $Cs_2SiF_6$, 0.3027 g of RbF, and 0.0049 g of $K_2MnF_6$ as raw material powders and manually mixing them using a mortar in the atmosphere. 1 g of the raw material powder mixture thus mixed was charged in a crucible, sintered at 300° C. for 3 hours while flowing hydrogen/nitrogen gases in 500 cc per minute into a sintering furnace, and crushed to obtain a phosphor composition. It was confirmed that red light was emitted if this phosphor composition was excited with a light source of 450 nm.

Example 4

1 g of a raw material powder mixture was obtained by respectively weighing 0.2381 g of $Rb_2SiF_6$, 0.4654 g of $Cs_2SiF_6$, 0.2918 g of RbF, and 0.0047 g of $K_2MnF_6$ as raw material powders and manually mixing them using a mortar in the atmosphere. 1 g of the raw material powder mixture thus mixed was charged in a crucible, sintered at 300° C. for 3 hours while flowing hydrogen/nitrogen gases in 500 cc per minute into a sintering furnace, and crushed to obtain a phosphor composition. It was confirmed that red light was emitted if this phosphor composition was excited with a light source of 450 nm.

Example 5

1 g of a raw material powder mixture was obtained by respectively weighing 0.1149 g of $Rb SiF_6$, 0.5989 g of $Cs_2SiF_6$, 0.2816 g of RbF, and 0.0046 g of $K_2MnF_6$ as raw material powders and manually mixing them using a mortar in the atmosphere. 1 g of the raw material powder mixture thus mixed was charged in a crucible, sintered at 300° C. for 3 hours while flowing hydrogen/nitrogen gases in 500 cc per minute into a sintering furnace, and crushed to obtain a phosphor composition. It was confirmed that red light was emitted if this phosphor composition was excited with a light source of 450 nm.

Example 6

1 g of a raw material powder mixture was obtained by respectively weighing 0.7234 g of $Cs SiF_6$, 0.2721 g of RbF, and 0.0044 g of $K_2MnF_6$ as raw material powders and manually mixing them using a mortar in the atmosphere. 1 g of the raw material powder mixture thus mixed was charged in a crucible, sintered at 300° C. for 3 hours while flowing hydrogen/nitrogen gases in 500 cc per minute into a sintering furnace, and crushed to obtain a phosphor composition. It was confirmed that red light was emitted if this phosphor composition was excited with a light source of 450 nm.

Example 7

1 g of a raw material powder mixture was obtained by respectively weighing 0.4856 g of $Cs_2SiF_6$, 0.5106 g of CsF, and 0.0039 g of $K_2MnF_6$ as raw material powders and manually mixing them using a mortar in the atmosphere. 1 g of the raw material powder mixture thus mixed was charged in a crucible, sintered at 300° C. for 3 hours while flowing hydrogen/nitrogen gases in 500 cc per minute into a sintering furnace, and crushed to obtain a phosphor composition. It was confirmed that red light was emitted if this phosphor composition was excited with a light source of 450 nm.

Example 8

1 g of a raw material powder mixture was obtained by respectively weighing 0.5516 g of $Cs_2SiF_6$, 0.4450 g of CsF, and 0.0034 g of $K_2MnF_6$ as raw material powders and manually mixing them using a mortar in the atmosphere. 1 g of the raw material powder mixture thus mixed was charged in a crucible, sintered at 300° C. for 3 hours while flowing hydrogen/nitrogen gases in 500 cc per minute into a sintering furnace, and crushed to obtain a phosphor composition. It was confirmed that red light was emitted if this phosphor composition was excited with a light source of 450 nm.

The crystal structures of the phosphor compositions thus prepared were analyzed using X-ray diffraction (XRD). FIG. 1 shows results obtained by interpreting crystal information using X-ray diffraction results on a phosphor prepared according to Example 1, and FIG. 2 shows results obtained by interpreting crystal information using X-ray diffraction results on a phosphor prepared according to Example 6.

From the analysis results of the crystal structure of the phosphor prepared according to Example 1, it was confirmed that the lattice constants of the host of the phosphor according to Example 1 were a=b=7.96349(8) Å, c=5.79546 (8) Å, and α=β=γ=90°, and the crystal lattice was tetragonal. In addition, it was confirmed that the lattice constants of the host of the phosphor according to Example 2 were a=b=8.2081(7) Å, c=6.02526(6) Å, and α=β=γ=90°, and the crystal lattice was tetragonal. FIG. 3 shows X-ray diffraction analysis results on Examples 1-6, and FIG. 4 shows X-ray diffraction analysis results on Examples 1, 6, 7 and 8. In case where the peak of the phosphors prepared according to Examples 1 to 8 was compared with the that of a $Rb_2CsSiF_7$ crystal phase (that is, the molar ratio of Rb, Cs and Si was 2:1:1), the phosphor composition according to the invention had the same basic crystal structure as the $Rb_2CsSiF_7$ crystal phase, and a small peak shift was generated according to the difference of a ratio between rubidium (Rb) and cesium (Cs).

In addition, with respect to the phosphor compositions prepared according to the embodiments of the invention, light-emitting properties were analyzed using a decay time measurement apparatus using PL and laser.

FIG. 5 shows measured results of absorption spectrum on Examples 1, 6, 7 and 8, and FIG. 6 shows measured results of emission spectrum on Examples 1, 6, 7 and 8. As confirmed in FIGS. 5 and 6, the phosphors according to Examples 1, 6, 7 and 8 of the invention showed excitation wavelengths of 365 to 480 nm and wavelengths of luminescent center of 610 to 670 nm. Meanwhile, Examples 1 and 6 of the invention showed relatively stronger light-emitting intensity than Examples 7 and 8, and it seems that the instability of the crystal structure was induced due to the increase of the mixing amount of cesium (Cs).

In Table 1 below, the ratio of raw materials and the molar ratio of the activator, used for synthesizing the phosphors according to Examples 1 to 8 of the invention, and the light-emitting wavelength of the phosphor thus synthesized are shown.

TABLE 1

| | Composition of raw material mixture | | | | Activator (RE) | | | Light-emitting |
|---|---|---|---|---|---|---|---|---|
| Example | $Rb_2SiF_6$ (g) | $Cs_2SiF_6$ (g) | RbF (g) | CsF (g) | Material | Mixing amount (g) | Molar ratio | wavelength (nm) |
| 1 | 0.6675 | 0.0000 | 0.3272 | 0.0000 | $K_2MnF_6$ | 0.0053 | 0.01 | 630 |
| 2 | 0.5132 | 0.1672 | 0.3145 | 0.0000 | $K_2MnF_6$ | 0.0051 | 0.01 | 630 |
| 3 | 0.3705 | 0.3219 | 0.3027 | 0.0000 | $K_2MnF_6$ | 0.0049 | 0.01 | 630 |
| 4 | 0.2381 | 0.4654 | 0.2918 | 0.0000 | $K_2MnF_6$ | 0.0047 | 0.01 | 630 |
| 5 | 0.1149 | 0.5989 | 0.2816 | 0.0000 | $K_2MnF_6$ | 0.0046 | 0.01 | 630 |
| 6 | 0.0000 | 0.7234 | 0.2721 | 0.0000 | $K_2MnF_6$ | 0.0044 | 0.01 | 630 |
| 7 | 0.0000 | 0.4856 | 0.0000 | 0.5106 | $K_2MnF_6$ | 0.0039 | 0.01 | 630 |
| 8 | 0.0000 | 0.5516 | 0.0000 | 0.4450 | $K_2MnF_6$ | 0.0034 | 0.01 | 630 |

Table 2 below and FIG. 7 show measured and compared results on decay times on Examples 1 and 6 of the invention and $K_2SiF_6:Mn^{4+}$ which is a commercial phosphor as the comparative example against the example of the invention.

TABLE 2

| Kind of phosphor | Decay time (time consumed to reach 10% of light-emitting intensity) |
|---|---|
| $K_2SiF_6:Mn^{4+}$ | 21.22 ms |
| Example 1 | 13.89 ms |
| Example 6 | 13.50 ms |

As confirmed in Table 2 and FIG. 7, the decay times until the light-emitting intensity were decreased to 10% for the phosphors prepared according to Examples 1 and 6 were 13.89 ms and 13.50 ms, respectively. On the contrary, it was found that the decay time of the commercially available phosphor $K_2SiF_6:Mn^{4+}$ was 21.22 ms, and was remarkably slower when compared with the phosphor of the invention.

Accordingly, if the phosphor according to the invention is applied to a light-emitting device such as a white LED, problems on afterglow phenomenon due to the increase of the decay time may be resolved.

What is claimed is:

1. A fluoride-based phosphor comprising a host having a composition of the following [Formula 1] including rubidium (Rb), cesium (Cs), silicon (Si) and fluorine (F) as constituent elements, and manganese (Mn) which is solid solution treated in the host as an activator:

$Rb_{3-x}Cs_xSiF_7$     [Formula 1]

(where, 0<x<3).

2. The fluoride-based phosphor according to claim 1, wherein a molar ratio of the rubidium (Rb), the cesium (Cs) and the silicon (Si), contained in the host is 2:1:1.

3. The fluoride-based phosphor according to claim 1, wherein a solid solution amount of the manganese (Mn) is 0.001 to 0.2 in a molar ratio.

4. The fluoride-based phosphor according to claim 1, having decay time, if measuring a time consumed for decreasing light-emitting intensity to 10%, of less than 14 ms.

5. The fluoride-based phosphor according to claim 1, wherein the phosphor has an excitation wavelength of 365 to 480 nm.

6. The fluoride-based phosphor according to claim 1, wherein the phosphor has a wavelength of luminescent center of 610 to 670 nm.

7. The fluoride-based phosphor according to claim 1, wherein a crystal structure of the host is tetragonal.

8. The fluoride-based phosphor according to claim 1, wherein the phosphor has a value variable within 10% with lattice constants of the host of a=b=8.1466 Å, and c=5.9650 Å.

* * * * *